(12) United States Patent
Furuta et al.

(10) Patent No.: US 7,906,889 B2
(45) Date of Patent: Mar. 15, 2011

(54) METAL OXIDE, PIEZOELECTRIC MATERIAL AND PIEZOELECTRIC ELEMENT

(75) Inventors: Tatsuo Furuta, Kawasaki (JP); Kaoru Miura, Matsudo (JP); Kenichi Takeda, Yokohama (JP); Makoto Kubota, Yokohama (JP); Hiroshi Funakubo, Yokohama (JP); Masaki Azuma, Kyoto (JP); Nobuhiro Kumada, Kofu (JP); Satoshi Wada, Kofu (JP); Takashi Iijima, Tsukuba (JP); Soichiro Okamura, Tokyo (JP)

(73) Assignees: Canon Kabushiki Kaisha, Tokyo (JP); Tokyo Institute of Technology, Tokyo (JP); Kyoto University, Kyoto-shi (JP); University of Yamanashi, Kofu-shi (JP); National Institute of Advanced Industrial Science and Technology, Tokyo (JP); Tokyo University of Science Educational Foundation Administrative Organization, Tokyo (JP)

( * ) Notice: Subject to any disclaimer, the term of this patent is extended or adjusted under 35 U.S.C. 154(b) by 187 days.

(21) Appl. No.: 12/470,699

(22) Filed: May 22, 2009

(65) Prior Publication Data

US 2009/0315432 A1    Dec. 24, 2009

(30) Foreign Application Priority Data

May 28, 2008 (JP) ................. 2008-140008
May 20, 2009 (JP) ................. 2009-122468

(51) Int. Cl.
*H01L 41/187* (2006.01)
*H01L 41/047* (2006.01)
*C04B 35/00* (2006.01)

(52) U.S. Cl. ................ 310/358; 310/363; 252/62.9 PZ; 252/62.9 R; 501/134

(58) Field of Classification Search ................. 310/358, 310/363; 252/62.9 PZ, 62.9 R; 501/134
See application file for complete search history.

(56) References Cited

U.S. PATENT DOCUMENTS

| | | | | |
|---|---|---|---|---|
| 6,126,743 | A * | 10/2000 | Saegusa et al. | 117/68 |
| 6,391,223 | B1 * | 5/2002 | Sawada et al. | 252/62.9 R |
| 7,033,521 | B2 * | 4/2006 | Iwashita et al. | 252/62.9 R |
| 7,470,390 | B2 * | 12/2008 | Nakamura et al. | 264/672 |
| 7,525,239 | B2 | 4/2009 | Aoki et al. | |

(Continued)

FOREIGN PATENT DOCUMENTS

JP     53-020597 A *  2/1978 ................ 333/151

(Continued)

OTHER PUBLICATIONS

Manuel Cardona, "Optical Properties and Band Structure of SrTiO3 and BaTiO3," Phys. Rev. 140, A651-A655 (1965) (Abstract).

(Continued)

*Primary Examiner* — Thomas M Dougherty
(74) *Attorney, Agent, or Firm* — Fitzpatrick, Cella, Harper & Scinto

(57) ABSTRACT

Provided are a piezoelectric material without using lead or an alkali metal, the piezoelectric material having a stable crystal structure in a wide temperature range, high insulation property, and high piezoelectric property, and a piezoelectric element using the piezoelectric material, in which the piezoelectric material is made of a metal oxide having a tetragonal crystal structure and expressed by $Ba(Si_xGe_yTi_z)O_3$ (here, $0 \leq x \leq 1$, $0 \leq y \leq 1$, and $0 \leq z \leq 0.5$), the piezoelectric element includes the piezoelectric material and a pair of electrodes sandwiching the piezoelectric material, and at least one of the pair of electrodes is made of $SrRuO_3$ or Ni.

6 Claims, 2 Drawing Sheets

U.S. PATENT DOCUMENTS

| | | | |
|---|---|---|---|
| 2004/0227611 A1* | 11/2004 | Chu et al. | 337/167 |
| 2006/0045840 A1 | 3/2006 | Chen et al. | |
| 2006/0172880 A1 | 8/2006 | Shirakawa et al. | |
| 2007/0202343 A1* | 8/2007 | Sprenger et al. | 428/432 |
| 2008/0072684 A1* | 3/2008 | Baniecki et al. | 73/777 |
| 2010/0025617 A1 | 2/2010 | Kubota et al. | |
| 2010/0025618 A1 | 2/2010 | Watanabe et al. | |
| 2010/0081559 A1 | 4/2010 | Zhang et al. | |

FOREIGN PATENT DOCUMENTS

| | | |
|---|---|---|
| WO | 2009/116683 A1 | 9/2009 |

OTHER PUBLICATIONS

Yoshitaka Uratani et al., "First-Principles Predictions of Giant Electric Polarization," Japanese Journal of Applied Physics, vol. 44, No. 9B, pp. 7130-7133 (Sep. 2005).

* cited by examiner

METAL OXIDE, PIEZOELECTRIC MATERIAL AND PIEZOELECTRIC ELEMENT

BACKGROUND OF THE INVENTION

1. Field of the Invention

The present invention relates to a metal oxide that can be used suitably as a piezoelectric material and to a piezoelectric element using the metal oxide.

2. Description of the Related Art

A piezoelectric material is used for a device such as an ultrasonic motor, a vibration sensor, an ink-jet printer head, a transformer, a filter or the like that utilizes a piezoelectric element as a piezoelectric material having electrodes. In addition, a piezoelectric material having ferroelectricity is also used for a device such as a ferroelectric memory.

A major piezoelectric material that has been used for a device contains lead. For instance, PZT (a product manufactured by Clevite Inc.) that is a solid solution of $PbTiO_3$ and $PbZrO_3$ is used as a typical piezoelectric material. Recently, however, there is a concern that lead exerts a negative effect on human bodies, and many countries have started to impose restrictions such as RoHS Directive on the use of lead in glass or high-temperature solder. Therefore, as a substitute for the existing material, piezoelectric materials used in various devices are also required to be a non-lead material that does not contain lead. However, there is a problem that most of non-lead piezoelectric materials that are presently developed have a phase transition temperature existing in a service temperature range, which leads to a problem such as insufficient insulation.

As a typical material among the non-lead piezoelectric materials, there is $BaTiO_3$. As to the insulation property of $BaTiO_3$, Ti has formal charge of 4+ and the number of d orbital electron is zero. Therefore, the band gap is as large as 3.2 eV, and it is proved that the material has good insulation property (M. Cardona, Phys. Rev. 140 (1965) A651.).

However, a crystal structure of $BaTiO_3$ transfers from a rhombohedral system to an orthorhombic system, then to a tetragonal system, and further to a cubic system as temperature rises. The temperature range of the tetragonal system is narrow as between −5 to 130° C. In particular, the cubic system of 130° C. or higher becomes paraelectric to lose piezoelectric properties, which is a problem for practical applications. To solve this problem, a certain material is doped for adjusting the temperature range to each specific use, which may deteriorate piezoelectric characteristics as a trade-off.

Concerning other material system, for example, there is $BiCoO_3$, which has a tetragonal structure in a Bi system of an A-site. The $BiCoO_3$ has a large value of c/a as 1.27 and a stable tetragonal structure in a wide temperature range −250° C. or higher to less than 240° C., which widens the service temperature range of the device.

However, in the $BiCoO_3$ structure, Co has formal charge of 3+, and d orbital is occupied formally by six electrons. Therefore, the band gap is small as 0.6 eV, and the insulation property is deteriorated (Yoshitaka URATANI, Tatsuya SHISHIDOU, Fumiyuki ISHII and Tamio OGUCHI, JPN. J. APPL. PHYS., PART1 44, 7130 (2005)).

It may be possible to adopt a method of doping other element for a purpose of improving the insulation property. However, this method may also deteriorate the piezoelectric characteristic simultaneously, so it cannot be an appropriate method. In addition, a piezoelectric material containing an alkali metal has a problem that it is vulnerable to environmental deterioration.

Considering the above-mentioned situation, it is necessary to provide a novel metal oxide that can be used as a piezoelectric material having high insulation property and a stable tetragonal structure in a wide temperature range.

SUMMARY OF THE INVENTION

The present invention has been made in view of the background art described above, and it is an object of the present invention to provide a metal oxide having stable tetragonal structure in a wide temperature range and high insulation property, and to provide a piezoelectric element using the metal oxide.

The metal oxide that can solve the above-mentioned problem is an oxide having a tetragonal crystal structure and expressed by $Ba(Si_xGe_yTi_z)O_3$ (here, $0 \leq x \leq 1$, $0 \leq y \leq 1$, $0 \leq z \leq 0.5$, and $x+y+z=1$). Also, the oxide can be suitably applied to a piezoelectric element.

The piezoelectric element that can solve the above-mentioned problem is characterized in that a piezoelectric material made of an oxide having a crystal structure of a tetragonal system and expressed by $Ba(Si_xGe_yTi_z)O_3$ (here, $0 \leq x \leq 1$, $0 \leq y \leq 1$, $0 \leq z \leq 0.5$, and $x+y+z=1$) is sandwiched by a pair of electrodes, and at least one of the pair of electrodes is $SrRuO_3$ or Ni.

The present invention can provide an oxide having a stable tetragonal structure in a wide temperature range and a high insulation property, and also a piezoelectric element using the oxide as a piezoelectric material.

Further features of the present invention will become apparent from the following description of exemplary embodiments with reference to the attached drawings.

DESCRIPTION OF THE EMBODIMENTS

Figure 1:
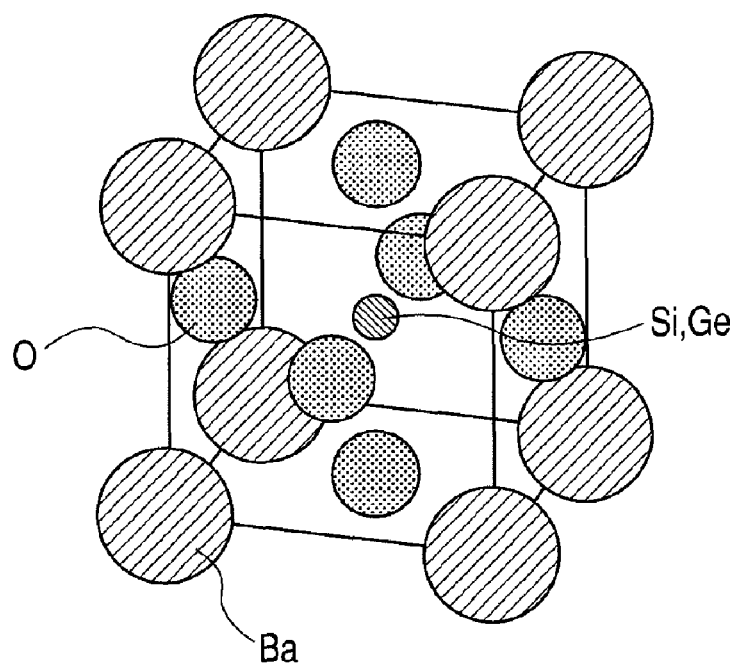
FIG. 1 is a diagram illustrating a tetragonal perovskite structure of $Ba(Si_xGe_{1-x})O_3$ according to the present invention.

Hereinafter, a detailed description will be given by taking, as an example, a case of using a metal oxide according to the present invention as a piezoelectric material. Of course, it is needless to say that a use of the compound of the present invention is not limited to as a piezoelectric material.

The metal oxide according to the present invention is characterized in that the metal oxide includes an oxide having a tetragonal crystal structure and expressed by $Ba(Si_xGe_yTi_z)O_3$ (here, $0 \leq x \leq 1$, $0 \leq y \leq 1$, $0 \leq z \leq 0.5$, and $x+y+z=1$).

The piezoelectric element according to the present invention is characterized in that a piezoelectric material made of an oxide having a crystal structure of a tetragonal system expressed by $Ba(Si_xGe_yTi_z)O_3$ (here, $0 \leq x \leq 1$, $0 \leq y \leq 1$, $0 \leq z \leq 0.5$, and $x+y+z=1$) is sandwiched by a pair of electrodes, and at least one of the pair of electrodes is $SrRuO_3$ or Ni.

It has been found that when the electrode is made, in particular, of $SrRuO_3$ or Ni, the piezoelectric material can easily have a tetragonal structure. Accordingly, selecting one of $SrRuO_3$ and Ni as a material of the electrode is advantageous in forming a piezoelectric material having a tetragonal structure.

As to the oxide described above, it is preferable that "$0.75 \leq x \leq 1$", "$0 \leq y \leq 0.25$" and "$z=0$" are satisfied. In the composition range described above, a piezoelectric constant $e_{31}$ has a particularly large value, which is appropriate. In addition, as to the oxide described above, it is preferable that "$0.2 \leq x \leq 0.33$", "$0.7 \leq y \leq 0.88$" and "$z=0$" are satisfied.

In the composition range described above, a piezoelectric constant $e_{33}$ has a large value in particular, which is appropriate.

Also, the piezoelectric material according to the present invention can obtain a peak value of the piezoelectric constant $e_{31}$ in the composition $Ba(Si_xGe_{1-x})O_3$ when "$x=1$" is satisfied.

In addition, the piezoelectric material according to the present invention can obtain a peak value of the piezoelectric constant $e_{33}$ in the composition $Ba(Si_xGe_{1-x})O_3$ when "$x=0.25$" is satisfied.

Hereinafter, elements contained in the metal oxide of the present invention and a method for simulating the electron state thereof will be described.

Si, Ge, and Ti are, in the state of ions, in one of the states where there is no d electron and where every d orbital is occupied by 10 electrons (hereinafter, those states are respectively referred to as d^ and d^10 of the formal charge, in which "^" indicates a superscript). When Si, Ge, and Ti having the formal charge of d^0 or d^10 are used, a piezoelectric material having high insulation property can be obtained.

In addition, it is preferable to use a structure having high tetragonality (a ratio of a c-axis length to an a-axis length in a unit crystal lattice) in order to stabilize the crystal structure in a wide temperature range. According to the present invention, a piezoelectric material of $Ba(Si_xGe_yTi_z)O_3$ (here, $0 \leq x \leq 1$, $0 \leq y \leq 1$, $0 \leq z \leq 0.5$, and $x+y+z=1$) having a tetragonal crystal structure is used to obtain high tetragonality and high insulation property.

The characteristics of the metal oxide according to the present invention were confirmed by two methods including a simulation of an electronic structure calculation called a first principles calculation and an experiment. First, a general outline of the first principles calculation will be described.

The first principles calculation is a generic term for electronic structure calculation methods that do not use any fitting parameter. The method enables the electronic structure calculation based only on the input of atomic numbers and coordinates of atoms constituting the unit crystal lattice or a molecule.

One of the first principles calculation methods includes a computation method called a pseudo-potential method. According to this method, potentials of atoms constituting atoms of the unit crystal lattice are prepared in advance and the electronic structure calculation is performed, which has a merit that a computation of structural optimization is also possible.

In addition, the electronic structure calculation of a system containing atoms at an arbitrary composition ratio can be performed relatively easily and accurately by a method called the virtual crystal approximation (VCA). The VCA is a method of performing the electronic structure calculation by preparing a potential of a virtual atom obtained by mixing a plurality of atoms at a certain composition ratio. Accordingly, when the electronic structure calculation is performed by the pseudo-potential method using the VCA, it is possible to calculate the electronic structure of a system containing atoms at an arbitrary composition ratio in the most stable structure.

As a first principles calculation package program of the pseudo-potential method using the VCA, there is a package program called "ABINIT" developed mainly by Professor X. Gonze of Cornell University. The values of the piezoelectric constant by the first principles calculation in the present specification are all obtained by the calculation using the "ABINIT".

(Evaluation Method in the Simulation)

Here, a usable temperature range according to the first principles calculation and the evaluation method of the insulation property will be described.

The usable temperature range can be obtained by the structural optimization of $Ba(Si_xGe_yTi_z)O_3$ and deriving the tetragonality (c/a ratio). In general, the larger the tetragonality is, the higher a structural phase transition temperature is. For instance, the tetragonality of $BaTiO_3$ is 1.01, which vanishes the piezoelectricity at a temperature of 130° C. or higher. In other words, when a material having tetragonality larger than that of $BaTiO_3$ is obtained, it can be estimated that the usable temperature range extends to the high temperature side.

In addition, the insulation property can be evaluated by calculating the band gap. In general, it is said that the insulation property is low when the band gap is small while it is high when the band gap is large. The band gap of $BiCoO_3$ is as small as 0.6 eV, so the insulation property thereof is also low. Therefore, when a piezoelectric material having a band gap larger than 0.6 eV is obtained, it is understood that the insulation property is higher than that of $BiCoO_3$.

(Manufacturing Process)

Next, a manufacturing process for obtaining the piezoelectric material according to the present invention will be described.

The form of $Ba(Si_xGe_yTi_z)O_3$ is not limited to a particular form but may be a sintered body of ceramics or a thin film.

To manufacture the piezoelectric material in the form of ceramics, raw material powders containing metal contents are mixed and sintered so that a desired molar composition can be obtained. Examples of a raw material powder of Ba include $BaCO_3$ and BaO. When $BaCO_3$ is used, it is preferable to carry out a decarboxylation reaction by temporary sintering step, prior to full sintering. In contrast, BaO may cause a reaction with moisture in the air, so it is preferable to handle the material in an inert atmosphere using a glove box or the like. A raw material powder of Si component includes $SiO_2$. A raw material powder of Ge component includes $GeO_2$. A raw material powder of Ti component includes $TiO_2$.

The mixture of the raw material powders may not be made solid-solute sufficiently by sintering under a normal pressure, depending on the composition ratio of the components. In this case, there may be adopted a method of using another type of energy in combination to obtain a target matter. The method includes a high pressure synthesis method in which a pressure is applied on the raw material powders while sintering. Other than that, a spark plasma sintering method, a microwave sintering method, a millimeter wave sintering method or the like can also be used.

In a case where the high pressure synthesis method is used for sintering the raw material powders, it is preferable to use an oxidizer such as $KClO_4$ together.

On the other hand, to manufacture the piezoelectric material in the form of thin film, a known method such as a sputtering method, a sol-gel method, a laser ablation method, or a CVD method can be used for forming the film. For instance, when a sputtering apparatus is used for forming the film, powders of $BaCO_3$, $SiO_2$, $GeO_2$, and $TiO_2$ are mixed at an arbitrary molar ratio and are uniaxially pressed by 10 MPa to prepare a modeled material as a target, so that the film formation is performed in the atmosphere of Ar and $O_2$ by an RF magnetron sputtering. In addition, the substrate is heated simultaneously so that the crystallization can be promoted. It is preferable to adjust the ratio of a substance amount of Ba to the sum of substance amounts of Si, Ge, and Ti contained in the film-formed metal oxide to be a value within the range of 0.99 to 1.1 when the composition is analyzed by a wavelength distributed fluorescent X-ray.

In addition, the substrate on which the piezoelectric material in the form of a thin film is formed is preferably a substrate including a single crystal of STO(100) on which a film of SRO of the (100) orientation is formed. Alternatively, it is more preferable to use a substrate including films of YSZ (100), $CeO_2$ (100) and $LaNiO_3$ (100) formed on a wafer of Si (100), and $SrRuO_3$ is formed thereon in the (100) orientation, or a substrate on which a film of Ni is formed, because in this case, the metal oxide having a tetragonal structure according to the present invention can be formed easily on the substrate. In addition, the tetragonal structure of the $Ba(Si_xGe_yTi_z)O_3$ can be obtained easily by adjusting a cooling rate after forming the film.

An electrically conductive material selected from a group consisting of SRO, Au, Pt, Ag, Ni, and the like is film-formed or pasted as an upper electrode on the thin film of $Ba(Si_xGe_yTi_z)O_3$ formed by the method described above, to thereby obtain the piezoelectric element having a pair of electrodes sandwiching the piezoelectric material.

In addition, besides this example, a crystalline substrate having a lattice constant similar to that of $Ba(Si_xGe_yTi_z)O_3$ can be used as the substrate so as to manufacture the piezoelectric material having a tetragonal crystal structure.

(Evaluation Method of Experimental Sample)

Here, a measurement method of the phase transition temperature of an experimental sample and a measurement method of the insulation property thereof will be described.

In order to determine the temperature range in which the piezoelectric material of $Ba(Si_xGe_yTi_z)O_3$ can be used preferably, the variation point of the crystal structure, i.e., the phase transition temperature is examined by carrying out an X-ray diffraction measurement while changing the ambient temperature of the experimental sample. According to the present invention, the X-ray diffraction measurement was carried out along with an increase of the temperature from a room temperature (of 25° C.) to 200° C. Hereinafter, this measurement method is referred to as a high temperature XRD method.

In this case, it is preferable that the phase transition point should not exist between room temperature and 200° C., so that it can be used preferably as a device.

In addition, the insulation property can be determined by applying a DC voltage across the electrodes on both sides of the manufactured piezoelectric element and measuring a resistance value thereof. It is preferable that the resistance value should be 10 GΩ·cm or larger so that it can be used as a practical device.

Although the number of oxygen atoms is 3 in each case described above, it may be smaller than 3.0 depending on sintering conditions, film forming conditions, and the like. When oxygen deficits increase, however, coercive electric field of the material increases and it becomes difficult to generate piezoelectric property in low electric field. Therefore, it is preferable that the number of oxygen atoms should be 2.9 or larger in the present embodiment.

Note that the room temperature is 25° C. in the following description.

Comparative Example 1

$BaTiO_3$

First, $BaTiO_3$ was manufactured by the high pressure synthesis for the purpose of comparison with the present invention. Barium monoxide (BaO) and titanium oxide ($TiO_2$) as raw material powders were mixed in a glove box of Ar atmosphere at the molar ratio of 1:1. This mixed powder was filled in a platinum capsule in which a trace quantity of $KClO_4$ was spread as an oxidizer. Then, the high pressure synthesis at 1200° C. and 6 GPa was implemented to manufacture the sintered body of $BaTiO_3$.

The crystal structure of the material $BaTiO_3$ manufactured by the process described above was analyzed by the high temperature XRD method. As a result, the tetragonal structure was observed at room temperature, and the structural phase transition was observed at 130° C. Therefore, the service temperature range is 130° C. or lower.

In addition, Pt was pasted on both sides of the obtained material $BaTiO_3$ to form electrodes, and a resistance value was measured by the DC voltage of 10 volts and at room temperature. As a result, it was 40 GΩ·cm.

Comparative Example 2

$Ba(Ge_{0.2}Ti_{0.8})O_3$

Next, $Ba(Ge_{0.2}Ti_{0.8})O_3$ was manufactured by the high pressure synthesis for the purpose of comparison with the present invention. Similarly to Comparative Example 1, barium carbonate ($BaCO_3$), germanium oxide ($GeO_2$), and titanium oxide ($TiO_2$) were mixed at a molar ratio of 5:1:4. After a trace quantity of $KClO_4$ was added as an oxidizer, the high pressure synthesis at 1200° C. and 6 GPa was implemented to manufacture the sintered body of $Ba(Ge_{0.2}Ti_{0.8})O_3$.

The crystal structure of the material $Ba(Ge_{0.2}Ti_{0.8})O_3$ manufactured by the process described above was analyzed by the high temperature XRD method. As a result, the tetragonal structure was observed at room temperature, and the structural phase transition temperature was 100° C. or lower. Therefore, it was determined that the service temperature range is smaller than that of $BaTiO_3$.

In addition, Pt was pasted on both sides of the obtained $Ba(Ge_{0.2}Ti_{0.8})O_3$ to form electrodes and a resistance value was measured by the DC voltage of 10 volts and at room temperature. As a result, it was 30 GΩ·cm.

Hereinafter, examples to which the present invention is applied will be described with reference to the drawings.

Examples 1 to 5

FIG. 1 is a diagram illustrating a tetragonal perovskite structure of $Ba(Si_xGe_{1-x})O_3$ according to the present invention.

As to the tetragonal perovskite structure having a simple lattice expressed by $Ba(Si_xGe_{1-x})O_3$ (here, $0 \leq x \leq 1$) illustrated in FIG. 1, Si and Ge are disposed in substantially the middle area of the octahedron formed by O ions, and the Ba ions form a face-centered structure together with the 0 ions. Here, Si and Ge have formal charges of d^0 and d^10, respectively, and are constituted of a combination of atoms having good insulation property as described above.

Table 1 shows a calculation result of the structural optimization of $Ba(Si_xGe_{1-x})O_3$ by the first principles calculation at each value of x.

TABLE 1

| X | a-axis length (nm) | c-axis length (nm) | Tetragonality |
|---|---|---|---|
| Example 1 | 0 | 0.3526 | 0.4867 | 1.38 |
| Example 2 | 0.25 | 0.3531 | 0.4866 | 1.378 |
| Example 3 | 0.5 | 0.353 | 0.4872 | 1.38 |
| Example 4 | 0.75 | 0.3523 | 0.4883 | 1.386 |
| Example 5 | 1 | 0.3505 | 0.49 | 1.398 |

In Table 1, the tetragonality is 1.30 or larger at any value of x and is larger than $BaTiO_3$ having the tetragonality of 1.01. From this result, it can be expected that a stable tetragonal structure be maintained at any value of x in $Ba(Si_xGe_{1-x})O_3$ within a temperature range wider than that of $BaTiO_3$. In addition, the band gap was calculated in each case of x=0, 0.5, or 1 in $Ba(Si_xGe_{1-x})O_3$, and the results were 1.1 eV, 1.2 eV, and 1.6 eV, respectively.

However, this result was obtained by the method using a local density approximation, and a band gap obtained by this method is usually underestimated. Therefore, the band gap is larger than at least a material containing a number of d orbital electrons, such as $BiCoO_3$ (the band gap of $BiCoO_3$ is 0.6 eV), and it can be said that the insulation property of $Ba(Si_xGe_{1-x})O_3$ is high.

Figure 2:
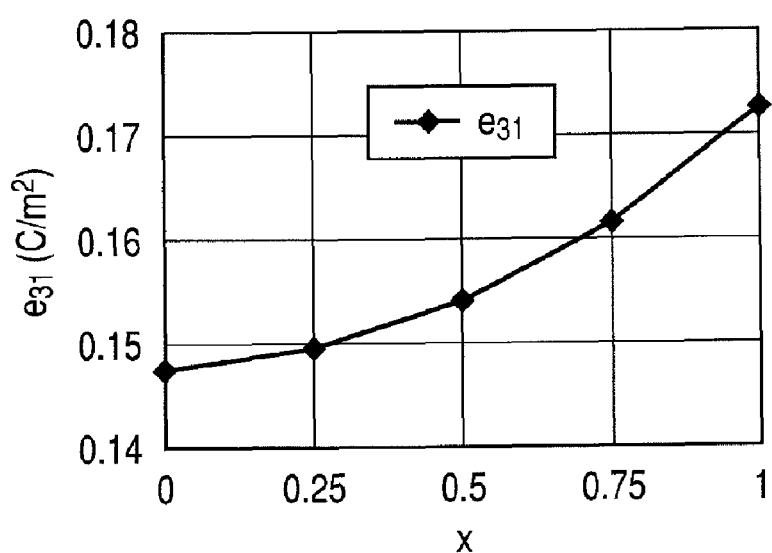
FIG. 2 is a diagram illustrating a piezoelectric constant $e_{31}$ at each value of x in the structure of $Ba(Si_xGe_{1-x})O_3$.
Figure 3:
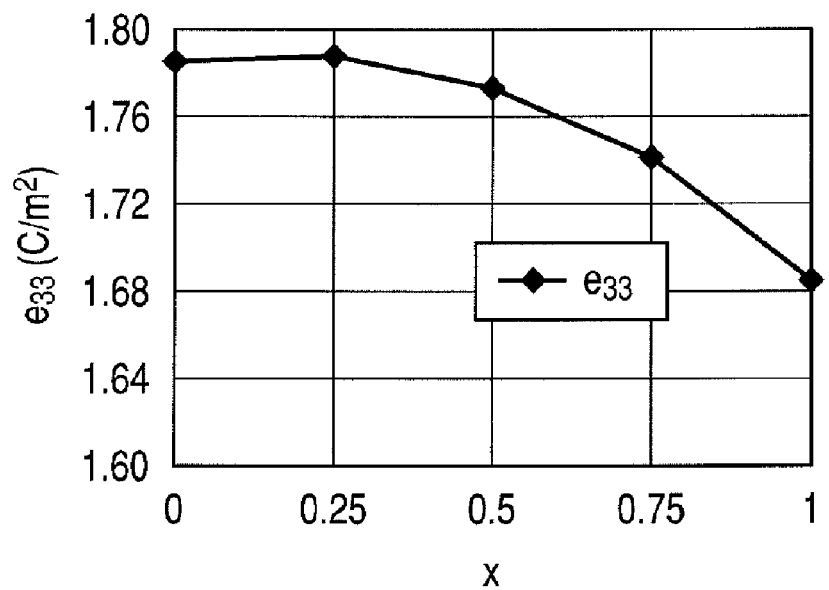
FIG. 3 is a diagram illustrating a piezoelectric constant $e_{33}$ at each value of x in the structure of $Ba(Si_xGe_{1-x})O_3$.

Next, a computation result of the piezoelectric constant at each value of x in $Ba(Si_xGe_{1-x})O_3$ is illustrated in FIGS. 2 and 3. In the drawings, $e_{31}$ and $e_{33}$ denote piezoelectric constants.

As understood from FIG. 2, the piezoelectric constant $e_{31}$ has the largest value when x is 1.0 (i.e., in $BaSiO_3$).

In addition, as understood from FIG. 3, the piezoelectric constant $e_{33}$ has the largest value when x is 0.25 (i.e., in $Ba(Si_{0.25}Ge_{0.75})O_3$). Here, each of the piezoelectric constants $e_{31}$ and $e_{33}$ indicates a stress generated in a unit electric field at a constant distortion. In the tetragonal structure, $e_{31}=e_{32}$ indicates stress in the x and the y axis directions with respect to the electric field in the z axis direction, and $e_{33}$ indicates stress in the z axis direction with respect to the electric field in the z axis direction.

From above, it is understood that $Ba(Si_xGe_{1-x})O_3$ can be a piezoelectric material stably having a high piezoelectric constant $e_{33}$ when "$0.2 \leq x \leq 0.3$" is satisfied.

Figure 4:
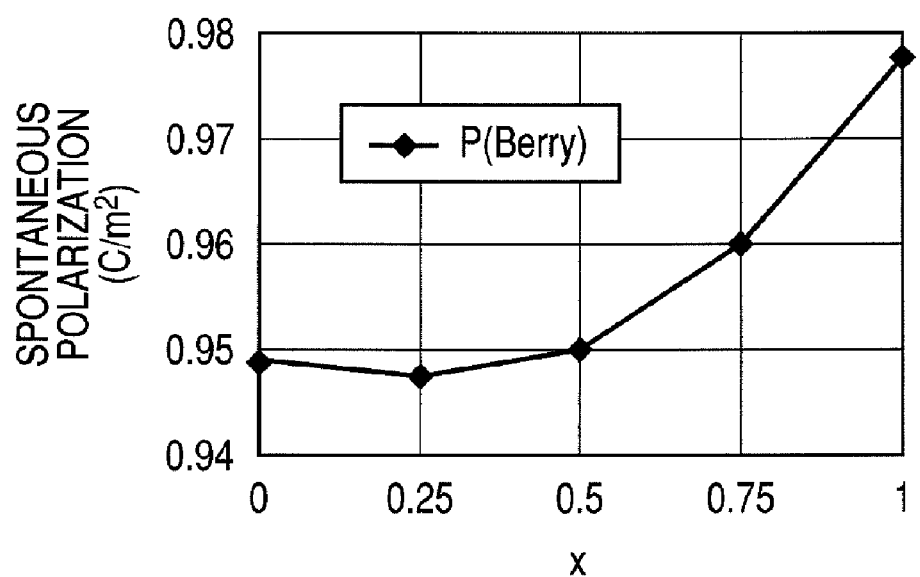
FIG. 4 is a diagram illustrating a polarization value at each value of x in the structure of $Ba(Si_xGe_{1-x})O_3$.

FIG. 4 illustrates a calculation result of spontaneous polarization P at each value of x in $Ba(Si_xGe_{1-x})O_3$ obtained by Berry's phase method. It has the maximum value when x is "1" and has a value of $0.94$ $C/m^2$ or larger at each value of x, which proves that the material has superior ferroelectricity. For this reason, the piezoelectric material of the present invention can be applied to the device such as a ferroelectric memory.

Example 6

Next, a result of the first principles calculation in a case of y=0 in $Ba(Si_xGe_yTi_z)O_3$ (x+y+z=1, $0 \leq x \leq 1$, $0 \leq y \leq 1$, and $0 \leq z \leq 1$) will be described.

Hereinafter, the case of y=0 in $Ba(Si_xGe_yTi_z)O_3$ is referred to as $Ba(Si_xTi_{1-x})O_3$ in every time.

Similarly to Example 1, a case of x=0.5 in $Ba(Si_xTi_{1-x})O_3$ was derived by the first principles calculation.

As a result, c/a became 1.29, and the band gap was 2.0 eV. It was understood from this fact that the insulation property is higher than that of $BiCoO_3$ and that a stable tetragonal structure can be maintained in a temperature range wider than that of $BaTiO_3$.

Next, a result of an experiment of manufacturing $Ba(Si_{0.5}Ti_{0.5})O_3$ by the high pressure synthesis will be described. In the present example, barium carbonate ($BaCO_3$), silicon dioxide ($SiO_2$), and titanium oxide ($TiO_2$) were mixed at a molar ratio of 2:1:1. The mixed powder was filled in a platinum capsule in which a trace quantity of $KClO_4$ was spread as an oxidizer, and it was sintered under the condition of 1200° C. and 6 GPa. As a result, a sintered body of $Ba(Si_{0.5}Ti_{0.5})O_3$ was obtained, which had a tetragonal structure as a main phase at room temperature.

The structure of $Ba(Si_{0.5}Ti_{0.5})O_3$ obtained by the above-mentioned method was analyzed by the high temperature XRD method, and no structural phase transition was observed in the temperature range from room temperature to 200° C. From this fact, it is understood that the phase transition temperature of $Ba(Si_{0.5}Ti_{0.5})O_3$ is 200° C. or higher and that the service temperature range thereof is wide. In addition, Pt was pasted on both sides of the obtained $Ba(Si_{0.5}Ti_{0.5})O_3$ to form electrodes, and a resistance value thereof was measured by the DC voltage of 10V at room temperature. Thus, high insulation property of 20 GΩ·cm was obtained.

Example 7

Next, an example will be given by taking a case of x=0 in $Ba(Si_xGe_yTi_z)O_3$ (x+y+z=1, $0 \leq x \leq 1$, $0 \leq y \leq 1$, and $0 \leq z \leq 1$).

Hereinafter, the case of x=0 in $Ba(Si_xGe_yTi_z)O_3$ is referred to as $Ba(Si_xTi_{1-x})O_3$ in every time.

Similarly to Example 1, a case of y=0.5 in $Ba(Ge_yTi_{1-y})O_3$ was derived by the first principles calculation.

As a result, c/a became 1.24, and the band gap was 1.18 eV. It was understood from this fact that the insulation property is higher than that of $BiCoO_3$ and is expected that a stable tetragonal structure can be maintained in a temperature range wider than that of $BaTiO_3$.

Next, a result of an experiment of manufacturing $Ba(Ge_{0.5}Ti_{0.5})O_3$ by the high pressure synthesis will be described. In the present example, barium carbonate ($BaCO_3$), germanium dioxide ($GeO_2$) and titanium oxide ($TiO_2$) were mixed at a molar ratio of 2:1:1, and similarly to Example 6, a sintered body of $Ba(Ge_{0.5}Ti_{0.5})O_3$ was obtained, which had a tetragonal structure as a main phase at room temperature.

A structure of $Ba(Ge_{0.5}Ti_{0.5})O_3$ obtained by the above-mentioned method exhibited no structural phase transition in the temperature range from room temperature to 200° C. From this fact, it is understood that the phase transition temperature of $Ba(Ge_{0.5}Ti_{0.5})O_3$ is 200° C. or higher so that the service temperature range thereof is wide. In addition, Pt was pasted on both sides of the obtained $Ba(Ge_{0.5}Ti_{0.5})O_3$ to form electrodes, and a resistance value thereof was measured by the DC voltage of 10V at room temperature. Thus, high insulation property of 23 GΩ·cm was obtained.

Example 8

Thin Film $BaSiO_3$

Next, an example using an RF magnetron sputtering apparatus will be described, by taking a case of $BaSiO_3$. In the present example, powders of $BaCO_3$ and $SiO_2$ were mixed at an arbitrary molar ratio (e.g., at 1:1) and were uniaxially pressed by 10 MPa so as to prepare a modeled body as a target. Then, a film having a thickness of 50 nm was formed thereon at a substrate heating temperature of 600° C. in an atmosphere of Ar and $O_2$. In addition, the substrate having electrodes was used, including SRO of (100) orientation formed on the monocrystalline substrate of STO (100).

In addition, Au electrode was formed on the film-formed $BaSiO_3$ so as to manufacture the piezoelectric element.

The $BaSiO_3$ manufactured by the method described above had a tetragonal structure as a main phase at room temperature, and no structural phase transition was observed by the XRD measurement in the temperature range from room temperature to 200° C. From this fact, it is understood that the phase transition temperature of $BaSiO_3$ is 200° C. or higher, and that the service temperature range thereof is wider than that of $BaTiO_3$. In addition, a resistance value thereof was measured by the DC voltage of 10V at room temperature, and high insulation property of 15 GΩ·cm was obtained.

Example 9

Thin Film $Ba(Si_{0.2}Ge_{0.8})O_3$

Next, similarly to Example 8, a thin film of $Ba(Si_{0.2}Ge_{0.8})O_3$ was manufactured. In the present example, powders of $BaCO_3$, $SiO_2$, and $GeO_2$ were mixed at an arbitrary molar ratio (e.g., at 5:1:4) and were uniaxially pressed by 10 MPa so as to prepare a modeled body as a target. Then, a film having a thickness of 50 nm was formed thereon at a substrate heating temperature of 600° C. in an atmosphere of Ar and $O_2$.

In addition, Au electrode was formed on the film-formed $Ba(Si_{0.2}Ge_{0.8})O_3$ so as to manufacture the piezoelectric element. The manufactured $Ba(Si_{0.2}Ge_{0.8})O_3$ had a tetragonal structure as a main phase at room temperature, and no structural phase transition was observed by the XRD measurement in the temperature range from room temperature to 200° C. From this fact, it is understood that the phase transition temperature of $Ba(Si_{0.2}Ge_{0.8})O_3$ is 200° C. or higher, and that the service temperature range thereof is wider than that of $BaTiO_3$. In addition, a resistance value thereof was measured by the DC voltage of 10V at room temperature, and high insulation property of 17 GΩ·cm was obtained.

Although the A-site was fixed to Ba in the examples described above, it was confirmed that the same effect was obtained using other alkaline-earth metal such as Ca and Sr.

In addition, although a single phase of $Ba(Si_xGe_yTi_z)O_3$ was exemplified in the present example, it is possible to manufacture the piezoelectric element in combination with other materials having a structure other than the tetragonal structure, and to adjust it to have a desired structural phase transition temperature, insulation property, and piezoelectric characteristic.

Here, although concrete values of x, y, and z in $Ba(Si_xGe_yTi_z)O_3$ were specified as examples thereof in Examples 1 to 9, it is needless to say that similar effect can be obtained by a composition having other combination of values of x, y, and z satisfying "x+y+z=1", "0≦x≦1", "0≦y≦1", and "0≦z≦1".

As to samples described in the Examples and Comparative Examples, a list of crystal systems, resistance values (GΩ·cm), band gaps (eV), and phase transition temperatures of individual compositions at room temperature (25° C.) is shown in Table 2.

From Table 2, it is understood that the piezoelectric material of the present invention has a resistance value bearing comparison with $BaTiO_3$ and exerts stable piezoelectric characteristic in a wide temperature range because no phase transition temperature exists in the temperature range from room temperature to 200° C.

TABLE 2

| Sample | x | y | z | Crystal system (25° C.) | Resistance value (GΩ · cm) | Band gap (eV) | Phase transition temperature |
|---|---|---|---|---|---|---|---|
| Example 1 | 0 | 1 | 0 | Tetragonal system | — | 1.1 | — |
| Example 2 | 0.25 | 0.75 | 0 | Tetragonal system | — | — | — |
| Example 3 | 0.5 | 0.5 | 0 | Tetragonal system | — | 1.2 | — |
| Example 4 | 0.75 | 0.25 | 0 | Tetragonal system | — | — | — |
| Example 5 Example 8 | 1 | 0 | 0 | Tetragonal system | 15 | 1.6 | 200° C. or higher |
| Example 6 | 0.5 | 0 | 0.5 | Tetragonal system | 20 | 2.0 | 200° C. or higher |
| Example 7 | 0 | 0.5 | 0.5 | Tetragonal system | 23 | 1.18 | 200° C. or higher |
| Example 9 | 0.2 | 0.8 | 0 | Tetragonal system | 17 | — | 200° C. or higher |
| Comparative Example 1 | 0 | 0 | 1 | Tetragonal system | 40 | 3.2 | 130° C. |
| Comparative Example 2 | 0 | 0.2 | 0.8 | Tetragonal system | 30 | — | 100° C. |

The piezoelectric material of the present invention, which does not use lead or an alkali metal, has a stable crystal structure in a wide temperature range, and is provided with high insulation property and piezoelectric property. Therefore, it can be used for a device such as an ultrasonic motor, a vibration sensor, an ink-jet printer head, a transformer, or a filter utilizing a piezoelectric element including a piezoelectric material and electrodes, or a device such as a ferroelectric memory utilizing its ferroelectricity.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2008-140008, filed May 28, 2008, and 2009-122468, filed May 20, 2009, which are hereby incorporated by reference in their entirety.

What is claimed is:

1. A metal oxide having a tetragonal crystal structure and expressed by $Ba(Si_xGe_yTi_z)O_3$, wherein "$0 \leq x \leq 1$", "$0 \leq y \leq 1$", "$0 \leq z \leq 0.5$" and "$x+y+z=1$" are satisfied.

2. The metal oxide according to claim 1, wherein "$0.75 \leq x \leq 1$", "$0 \leq y \leq 0.25$", and "$z=0$" are satisfied.

3. The metal oxide according to claim 1, wherein "$0.2 \leq x \leq 0.3$", "$0.7 \leq x \leq 0.8$", and "$z=0$" are satisfied.

4. The metal oxide according to claim 1, wherein the metal oxide is a piezoelectric material.

5. A piezoelectric element, comprising:
a piezoelectric material made of the metal oxide according to claim 1; and
a pair of electrodes sandwiching the piezoelectric material.

6. The piezoelectric element according to claim 5, wherein at least one of the pair of electrodes is made one of $SrRuO_3$ and Ni.

* * * * *